United States Patent
Przybysz et al.

(10) Patent No.: US 10,884,033 B2
(45) Date of Patent: Jan. 5, 2021

(54) CURRENT DEVICE READOUT SYSTEM

(71) Applicants: Anthony Joseph Przybysz, Linthicum, MD (US); David George Ferguson, Takoma Park, MD (US); Moe S. Khalil, Baltimore, MD (US)

(72) Inventors: Anthony Joseph Przybysz, Linthicum, MD (US); David George Ferguson, Takoma Park, MD (US); Moe S. Khalil, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 44 days.

(21) Appl. No.: 16/277,560

(22) Filed: Feb. 15, 2019

(65) Prior Publication Data

US 2020/0264213 A1    Aug. 20, 2020

(51) Int. Cl.
| | | |
|---|---|---|
| *G01R 19/00* | (2006.01) | |
| *G06N 10/00* | (2019.01) | |
| *G01R 33/035* | (2006.01) | |
| *G11C 11/44* | (2006.01) | |
| *H01L 39/02* | (2006.01) | |

(52) U.S. Cl.
CPC ....... *G01R 19/0092* (2013.01); *G01R 33/035* (2013.01); *G06N 10/00* (2019.01); *G11C 11/44* (2013.01); *H01L 39/025* (2013.01)

(58) Field of Classification Search
CPC .. G01R 19/0092; G01R 33/035; G06N 10/00; G11C 11/44; H01L 39/025
See application file for complete search history.

(56) References Cited

U.S. PATENT DOCUMENTS

| 2019/0013065 A1 | 1/2019 | Przybysz et al. |
| 2019/0019098 A1 | 1/2019 | Przybysz |
| 2019/0044044 A1* | 2/2019 | Lampert ........... H01L 27/18 |

OTHER PUBLICATIONS

R. Harris, et al.,"Experiment Demonstration of a Robust and Scalable Flux Qubit."; the American Physical Society; Physical Review B 81, 134510; DOI: 10.1103/PhysRevB.81.134510; arXiv:0909.4321v1 (2010).
R. Harris, et al, "Compound Josephson-Junction Coupler for Flux qubits with Minimal Crosstalk"; the American Physical Society; PRB 80, 052506 (2009).

(Continued)

*Primary Examiner* — Clayton E. LaBalle
*Assistant Examiner* — Michael A Harrison
(74) *Attorney, Agent, or Firm* — Tarolli, Sundheim, Covell & Tummino LLP

(57) ABSTRACT

One example includes a current device readout system. The system includes a tunable resonator having a resonant frequency that is associated with a current state of a current device. The tunable resonator can be configured to receive a tone signal having a predetermined frequency from a feedline to determine the current state of the current device. The system also includes an isolation device inductively interconnecting the tunable resonator and the current device. The isolation device can be tunable to isolate the current device in a first state and to facilitate the determination of the current state of the current device in a second state.

20 Claims, 3 Drawing Sheets

(56) References Cited

OTHER PUBLICATIONS

C. Quintana, et al, "Observation of a classical-quantum crossover in 1/f flux noise and its paramagnetic temperature dependence"; American Physical Society; PRL 118, 057702 (2017); arXiv:1608.08752 (2017).
International Search Report for PCT/US2020/015646 dated May 13, 2020.

\* cited by examiner

250 ↘

┌─ 252
PROVIDE A FIRST FLUX BIAS TO A QUANTUM FLUX PARAMETRON (QFP) THAT INDUCTIVELY INTERCONNECTS A TUNABLE RESONATOR AND THE CURRENT DEVICE TO SET THE QFP TO A FIRST QFP STATE TO INDUCTIVELY ISOLATE THE TUNABLE RESONATOR AND THE CURRENT DEVICE

┌─ 254
PROVIDE A SECOND BIAS FLUX TO THE QFP TO SET THE QFP TO A SECOND QFP STATE TO SET A RESONANT FREQUENCY OF THE TUNABLE RESONATOR ASSOCIATED WITH THE CURRENT STATE OF THE CURRENT DEVICE

┌─ 256
PROVIDE A TONE SIGNAL HAVING A PREDETERMINED FREQUENCY FROM A FEEDLINE TO THE TUNABLE RESONATOR

┌─ 258
MONITOR THE FEEDLINE IN RESPONSE TO PROVIDING THE TONE SIGNAL TO DETERMINE THE CURRENT STATE OF THE CURRENT DEVICE

FIG. 6

CURRENT DEVICE READOUT SYSTEM

GOVERNMENT INTEREST

The invention was made under Government Contract Number 30059298. Therefore, the US Government has rights to the invention as specified in that contract.

TECHNICAL FIELD

This disclosure relates generally to quantum and classical computing systems, and more specifically to a current device readout system.

BACKGROUND

In quantum computer architectures based on circuit quantum electrodynamics (cQED), it is a common practice to multiplex a plurality of qubit readout resonators onto a single transmission line. Readout operations can be performed by coupling each of the qubit readout resonators having a slightly different resonant frequency via a fixed mutual inductance or a fixed capacitor to the transmission line, with typical coupling Q's on the order of several thousands. While stronger coupling is typically desirable for faster readout times, it also contributes to higher decoherence in the circuit, limiting the time that the circuit is available for computation. Readout fidelity of qubits is partially limited by the qubit energy relaxation through the resonator into the transmission line. Additionally, it is desirable to isolate the qubits from the transmission during logic and/or storage operations of the qubit. Current techniques suffer in either strong coupling and/or isolation of the qubit readout resonators to and from the single 50-ohm transmission line.

SUMMARY

One example includes a current device readout system. The system includes a tunable resonator having a resonant frequency that is associated with a current state of a current device. The tunable resonator can be configured to receive a tone signal having a predetermined frequency from a feedline to determine the current state of the current device. The system also includes an isolation device inductively interconnecting the tunable resonator and the current device. The isolation device can be tunable to isolate the current device in a first state and to facilitate the determination of the current state of the current device in a second state.

Another example includes a method for reading a current state of a current device. The method includes providing a first flux bias to a quantum flux parametron (QFP) that inductively interconnects a tunable resonator and the current device to set the QFP to a first QFP state to inductively isolate the tunable resonator and the current device. The current device can have current state corresponding to one of a first current state and a second current state. The method also includes providing a second bias flux to the QFP to set the QFP to a second QFP state to set a resonant frequency of the tunable resonator associated with the current state of the current device. The method also includes providing a tone signal having a predetermined frequency from a feedline to the tunable resonator. The method further includes monitoring the feedline in response to providing the tone signal to determine the current state of the current device.

Another example includes a current device readout system. The system includes a tunable resonator having a resonant frequency that is associated with a current state of a flux qubit. The tunable resonator can be configured to receive a tone signal having a predetermined frequency from a feedline to determine the current state of the flux qubit. The system also includes a quantum flux parametron (QFP) inductively interconnecting the tunable resonator and the flux qubit. The QFP can be tunable to inductively isolate the flux qubit and the tunable resonator in a first QFP state and to amplify the current state of the current device to facilitate the determination of the current state of the current device in a second QFP state.

BRIEF DESCRIPTION OF THE DRAWINGS

FIG. 6 illustrates an example of a method for reading a current state of a current device.

DETAILED DESCRIPTION

This disclosure relates generally to quantum and classical computing systems, and more specifically to a current device readout system. The current device readout system includes a tunable resonator and one or more isolation devices. The tunable resonator can be coupled to a feedline and can have a resonant frequency that is associated with a current state of a current device to be read. For example, during a readout of the current device, the resonant frequency of the tunable resonator can have a first resonant frequency based on a first current state of the current device, and can have a second resonant frequency based on a second current state of the current device. Therefore, the tunable resonator can be configured to receive a tone signal having a predetermined frequency from a feedline to determine the current state of the current device. For example, the feedline can be monitored for a frequency response in response to application of the tone signal based on whether the tone signal was on-resonance or off-resonance with the resonant frequency of the tunable resonator.

The current device readout system also includes an isolation device that is inductively coupled to the tunable resonator and the current device. For example, the isolation device can be configured as a quantum flux parametron (QFP), and the current device can be configured as a flux qubit, but could also correspond to any of a variety of hysteretic devices that conducts current in a direction that corresponds to a stored state to be read by the current device readout system. The isolation device is configured to be tuned (e.g., via a flux) to isolate the current device from the tunable resonator in a first state, and to amplify the current state of the current device to provide the current state to the tunable resonator to set the resonant frequency of the tunable resonator in a second state. Therefore, in the second state, the tunable resonator can have a resonant frequency that is indicative of the current state to facilitate readout of the current state in response to the tone signal.

Figure 1:
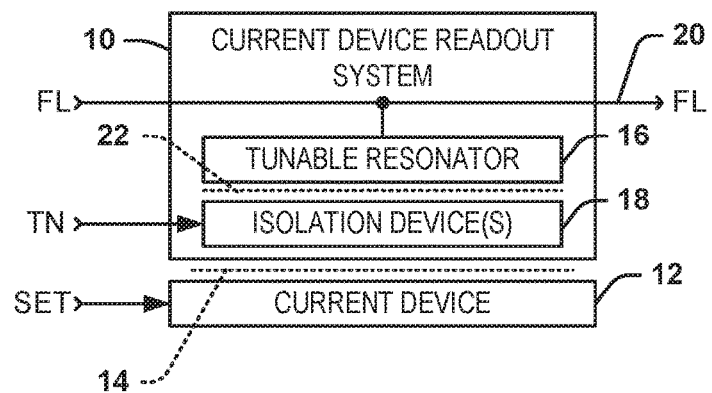
FIG. 1 illustrates an example of a current device readout system.

FIG. 1 illustrates an example of a current device readout system 10. The current device readout system 10 can be implemented in a number of quantum and classical computer architectures. For example, the current device readout system 10 can be implemented to provide data readout in a quantum logic system. The current device readout system 10 is configured to read a current state of a current device 12 that is demonstrated as inductively coupled to the current device readout system 10, as demonstrated by dotted lines 14. As described herein, the term "current state" refers to a direction of current flow in a current-carrying element of the current device 12. In the example of FIG. 1, the current device 12 is tunable via a signal "SET", such that the current device 12 is hysteretic to maintain the current state in response to the signal SET. For example, the current device 12 can be configured as a flux qubit, such that the current state corresponds to a flux state of the flux qubit. However, it is to be understood that the current device 12 could alternatively correspond to any of a variety of hysteretic devices that conducts current in a direction that corresponds to a stored state to be read by the current device readout system 10.

The current device readout system 10 includes a tunable resonator 16 and an isolation device 18. The tunable resonator 16 is demonstrated in the example of FIG. 1 as being coupled to a feedline 20 that is configured to provide a tone signal FL having a predetermined frequency. As described in greater detail herein, the tunable resonator 16 can have a resonant frequency that is associated with a current state of the current device 12. For example, during a readout of the current device 12, the resonant frequency of the tunable resonator 16 can have a first resonant frequency based on a first current state (e.g., a first direction of current) of the current device 12, and can have a second resonant frequency based on a second current state (e.g., a second direction of current) of the current device 12. Therefore, the tunable resonator 16 can receive the tone signal FL during the readout of the current device 12 from the feedline 20 to determine the current state of the current device 12. For example, the feedline 20 can be monitored (e.g., via monitoring circuitry not demonstrated in the example of FIG. 1) for a frequency response in response to application of the tone signal FL based on whether the tone signal FL was on-resonance or off-resonance with the resonant frequency of the tunable resonator 16.

The isolation device 18 is demonstrated as inductively coupled to the tunable resonator 16 and the current device 12, via dotted lines 22 and the dotted lines 14, respectively. For example, the isolation device 18 can be configured as a quantum flux parametron (QFP). In the example of FIG. 1, the isolation device 18 is configured to be tuned via a signal TN to set the isolation device 18 in either a first state or a second state. As an example, the signal TN can be a flux signal that is inductively coupled to the isolation device 18 to induce a flux in the isolation device 18, such as one of a stable flux of approximately $\Phi_0/2$ corresponding to the first state and a stable flux of approximately $\Phi_0$ corresponding to the second state. For example, in the first state, the isolation device 18 can be configured to isolate the current device 12 from the tunable resonator 16, such as to prevent a flux associated with the tunable resonator 16 from affecting the current device 12. As another example, in the second state, the isolation device 18 can be configured to amplify the current state of the current device 12 to provide the current state to the tunable resonator 16 to set the resonant frequency of the tunable resonator 16. Therefore, in the second state, the tunable resonator 16 can have a resonant frequency that is indicative of the current state to facilitate readout of the current state of the current device 12 in response to the tone signal FL.

Therefore, based on the arrangement of the current device readout system 10, the current state of the current device 12 can be read in a manner that allows for strong isolation of the current device 12 from the tunable resonator 16 in a first state of the isolation device 18 and allows for strong coupling of the state of the current device 12 to the tunable resonator 16 in a second state of the isolation device 18. In addition, by providing the inductively interposing isolation device 18, the current device readout system 10 can substantially mitigate decoherence associated with the current state of the current device 12 with respect to environmental considerations (e.g., spurious sources of flux). Accordingly, the current device readout system 10 can provide for improved readout operation relative to readout systems that provide direct coupling of a tunable resonator to an associated current device.

Figure 2:
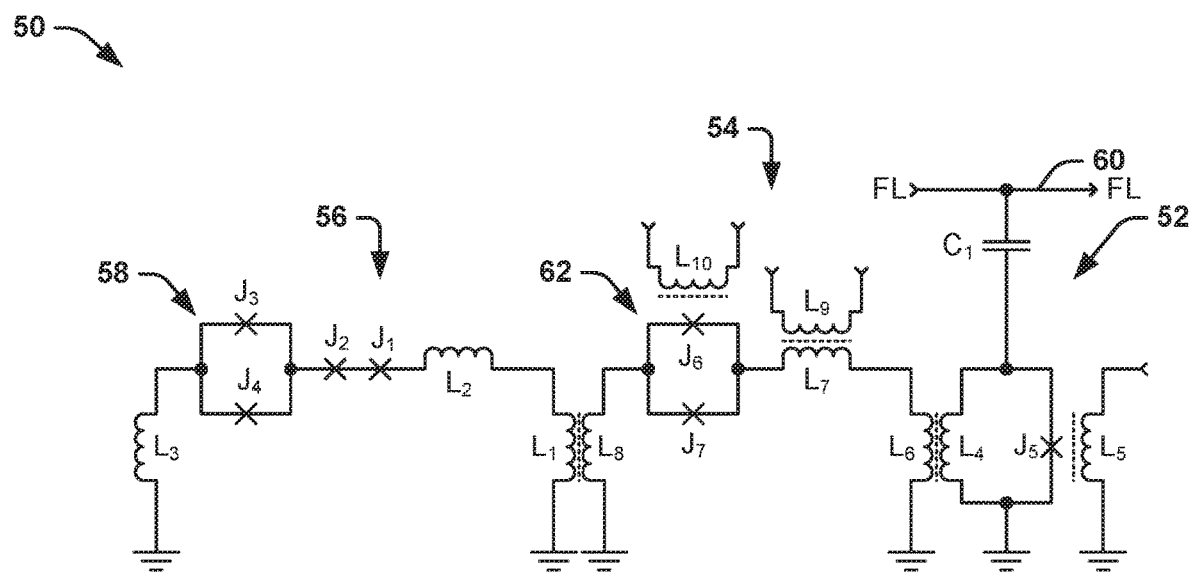
FIG. 2 illustrates an example circuit diagram of a flux qubit readout system.

FIG. 2 illustrates an example circuit diagram of a flux qubit readout system 50. The flux qubit readout system 50 can be implemented in a number of quantum and classical computer architectures. As an example, the flux qubit readout system 50 can correspond to the current device readout system 10 in the example of FIG. 1. Therefore, reference is to be made to the example of FIG. 1 in the following description of the example of FIG. 2.

The flux qubit readout system 50 includes a tunable resonator 52 and a QFP 54. The QFP 54 is demonstrated as inductively coupled to a flux qubit 56, such that the flux qubit readout system 50 is configured to read the flux state corresponding to a circulating current direction of the flux qubit 56. Therefore, the QFP 54 can correspond to the isolation device 18 in the example of FIG. 1, and the flux qubit 56 can correspond to current device 12 in the example of FIG. 1, with the flux state of the flux qubit 56 corresponding to the current state of the current device 12. The flux qubit 56 is demonstrated in the example of FIG. 2 as including an inductor $L_1$, an inductor $L_2$, a pair of Josephson junctions $J_1$ and $J_2$ arranged in series, a DC squid formed from a compound Josephson junction (CJJ) 58 that includes a parallel pair of Josephson junctions $J_3$ and $J_4$, and an inductor $L_3$. In the example of FIG. 2, the flux qubit 56 can be tunable (e.g., via the signal SET; not shown in the example of FIG. 2), such that the flux qubit 56 is hysteretic to maintain the flux state based on the circulating current direction.

In the example of FIG. 2, the tunable resonator 52 is demonstrated as being coupled to a feedline 60 via a capacitor $C_1$. The feedline 60 is configured to provide a tone signal FL having a predetermined frequency, similar to as described previously. The capacitor $C_1$ is configured to provide strong capacitive coupling of the tone signal FL to the tunable resonator 52 to provide for rapid readout of the state of the flux qubit 56. The tunable resonator 52 is demonstrated as including a Josephson junction $J_5$ and an inductor $L_4$. The tunable resonator 52 can be configured to have a resonant frequency that is associated with a current state of the flux qubit 56 during readout of the flux qubit 56. In the example of FIG. 2, the tunable resonator 52 is tuned via a static flux $\Phi_{RES}$ that is inductively provided via an inductor $L_5$. The static flux $\Phi_{RES}$ can thus provide a resonant state of tunable resonator 52 to provide for a large frequency difference of the tunable resonator 52 between the two flux states of the flux qubit 56.

For example, during a readout of the flux qubit 56, the resonant frequency of the tunable resonator 52 can have a first resonant frequency based on the first flux state of the flux qubit 56, and can have a second resonant frequency based on the second flux state of the flux qubit 56, with the first and second flux states having a large frequency difference in response to the static flux $\Phi_{RES}$. Therefore, in response to the tone signal FL provided from the feedline 60 during the readout of the state of the flux qubit 56, the tone signal FL can be either on-resonance with the resonant frequency of the tunable resonator 52 (e.g., in the first flux state), or off-resonance with the resonant frequency of the tunable resonator 52 (e.g., in the second flux state). Accordingly, the feedline 60 can be monitored (e.g., via monitoring circuitry not demonstrated in the example of FIG. 2) for a frequency response in response to application of the tone signal FL based on whether the tone signal FL was on-resonance or off-resonance with the resonant frequency of the tunable resonator 52.

In the example of FIG. 2, the QFP 54 is demonstrated as a radio frequency (RF) superconducting quantum interference device (SQUID) that includes an inductor $L_6$, an inductor $L_7$, an inductor $L_8$, and a DC squid formed from a CJJ 62 that includes a parallel pair of Josephson junctions $J_6$ and $J_7$. The QFP 54 is inductively coupled to the tunable resonator 52 via an inductive coupling of the inductor $L_6$ to the inductor $L_4$ of the tunable resonator 52. Similarly, the QFP 54 is inductively coupled to the flux qubit 56 via an inductive coupling of the inductor $L_8$ to an inductor $L_1$ of the flux qubit 56. In the example of FIG. 2, the QFP 54 is tunable via a first flux signal $TN_1$ and a second flux signal $TN_2$ that are provided via an inductor $L_9$ and an inductor $L_{10}$, respectively. The inductor $L_{10}$ is inductively coupled to the CJJ 62 to tune the effective critical current of the Josephson junctions $J_6$ and $J_7$ to set the QFP 54 in either a first QFP state or a second QFP state. The inductor $L_9$ is inductively coupled to the inductor $L_7$ to bias the QFP 54 to set a threshold to facilitate amplification of the flux state of the flux qubit 56 to copy and robustly store the circulating current of the flux qubit 56 as flowing in the QFP 54 in a first direction corresponding to the first flux state of the flux qubit 56 and in a second direction corresponding to the second flux state of the flux qubit 56.

The flux signal $TN_1$ can thus provide a flux in the QFP 54, such as one of a stable flux of approximately $\Phi_0/2$ corresponding to the first QFP state and a stable flux of approximately $\Phi_0$ corresponding to the second QFP state. For example, the flux signal $TN_1$ can induce the flux approximately $\Phi_0/2$ in the QFP 54 in the first QFP state to provide isolation of the flux qubit 56 from the tunable resonator 52, such as to prevent a flux associated with the tunable resonator 52 from affecting the flux qubit 56. As another example, the flux signal $TN_1$ can adiabatically increase to adiabatically increase the flux of the QFP 54 to the flux approximately $\Phi_0$ corresponding to the second QFP state. In the second QFP state, the QFP 54 can amplify the flux state of the flux qubit 56 to provide the same flux state to the QFP 54, and thus to provide the flux state from the QFP 54 to the tunable resonator 52. As a result of the flux state being provided to the tunable resonator 52, the resonant frequency of the tunable resonator 52 can be set as one of the first and second resonant frequencies, as described previously. Therefore, in the second QFP state, the tunable resonator 52 can have a resonant frequency that is indicative of the flux state of the flux qubit 56 to facilitate readout of the flux state of the flux qubit 56 in response to the tone signal FL.

As described previously, in the second QFP state of the QFP 54, the QFP 54 can amplify the flux state of the flux qubit 56, at which time the flux state of the flux qubit 56 is stored in the QFP 54, and can therefore be provided to the tunable resonator 52. Additionally, during the second QFP state of the QFP 54, the flux state of the flux qubit 56 is robustly maintained in the QFP 54. Therefore, any spurious noise sources that may affect the flux qubit 56 will not affect the readout of the flux qubit 54 by the tunable resonator 52 based on the flux state being robustly stored in the QFP 54. As a result, the flux qubit 56 does not need to maintain the stored flux state when the tunable resonator 52 is activated, given that the flux state is stored in the QFP 54. In other words, after the QFP 54 is switched to the second QFP state via the adiabatic increase in stable flux approximately $\Phi_0$, when the flux state is read out by the tunable resonator 52, the flux state is read out from the QFP 54 by the tunable resonator 52 and not from the flux qubit 56. Accordingly, changes to the flux state of the flux qubit 56 do not affect the readout of the flux state in the second QFP state of the QFP 54.

Examples of the operation of the QFP 54 are described as follows. For example, the QFP 54 can have a mutual inductance parameter $\beta_L$, described as:

$$\beta_L(\Phi_\alpha^{qfp}) = \frac{4\pi I_0^{qfp} L_{qfp}}{\Phi_0}\left(\frac{\pi \Phi_\alpha^{qfp}}{\Phi_0}\right), \qquad \text{Equation 1}$$

Where: $I_0^{qfp}$ is a critical current of the Josephson junctions $J_6$ and $J_7$;
$L_{qfp}$ is a sum of all geometrical inductances in the QFP 54 loop; and
$\Phi_\alpha^{qfp}$ is the flux applied by the flux signal $TN_1$.

The number of potentially stable flux states $n_\Phi$ of the QFP 54 can be described by $n_\Phi = 1 + \beta_L$, so once $\beta_L > 1$, the QFP 54 can be in one of two circulating current states corresponding to the respective first and second flux states of the QFP 54. As described previously, the QFP 54 can initially be tuned via the flux signal $TN_1$ to set $\Phi_\alpha^{qfp} = \Phi_0/2$, such that the effective critical current proportional to $\beta_L$ is 0, thereby isolating the flux qubit 56 from the tunable resonator 52 based on a mutual inductance of approximately zero. To provide a readout of the flux qubit 56, the QFP 54 can be tuned via the flux signal $TN_1$ to adiabatically increase $\Phi_\alpha^{qfp}$ such that the QFP 54 emulates the circulating current state of the flux qubit 56 based on the flux it senses from the flux qubit 56.

Additionally, having a tunable critical current proportional to $\beta_L$ also allows for the tuning of a susceptibility $\chi$ of the QFP 54. The QFP 54 can thus provide a tunable mutual inductance between the flux qubit 56 and further readout circuitry, such as described by $M_{eff} = M_{qu,qfp} M_{qfp,ro} \chi$, where $M_{a,b}$ is the mutual inductance between elements a and b, and $\chi$ is the magnetic susceptibility of the QFP 54. As an example, the magnetic susceptibility of the QFP 54 can be described as follows:

$$\chi(\Phi_\alpha^{qfp}) = \frac{1}{L_{qfp}}\left(\frac{\beta_L(\Phi_\alpha^{qfp})}{\beta_L(\Phi_\alpha^{qfp}) + 1}\right). \qquad \text{Equation 2}$$

As an example, for an idle point of $\Phi_\alpha^{qfp} = \Phi_0/2$, $\chi = 0$ and, thus, $M_{eff} = 0$, the flux qubit 56 can be inductively isolated from other possibly noisy circuitry that may be coupled to the QFP 54, thus providing further isolation of the flux qubit 56 from environmental conditions (e.g., spurious flux sources).

Therefore, based on the arrangement of the flux qubit readout system 50, the flux state of the flux qubit 56 can be read in a manner that allows for strong isolation of the flux qubit 56 from the tunable resonator 52 (and other potential flux sources) in a first QFP state of the QFP 54 and allows for strong coupling of the state of a flux qubit 56 to the tunable resonator 52 in a second QFP state of the QFP 54. Accordingly, the flux qubit readout system 50 can provide for improved readout operation relative to readout systems that provide direct coupling of a tunable resonator to an associated current device.

Figure 3:
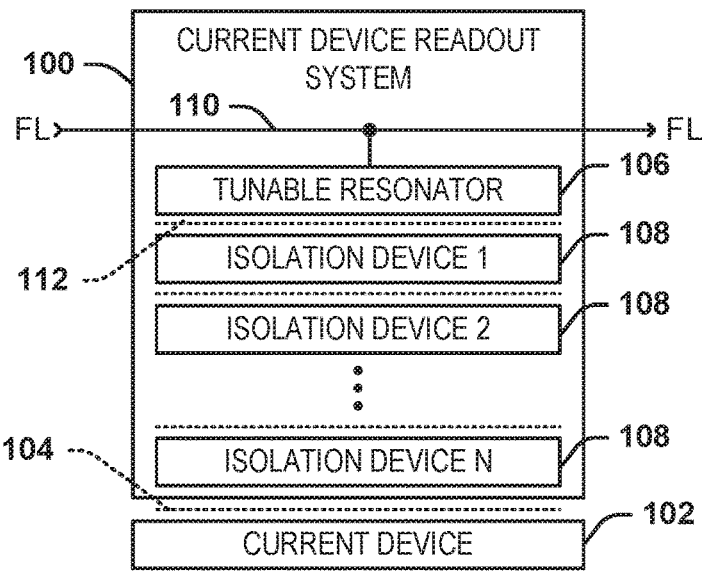
FIG. 3 illustrates another example of a current device readout system.

FIG. 3 illustrates an example of a current device readout system 100. The current device readout system 100 can be implemented in a number of quantum and classical computer architectures to provide data readout in a quantum logic system. In the example of FIG. 3, the current device readout system 100 is configured to read a current state of a current device 102 that is demonstrated as inductively coupled to the current device readout system 100, as demonstrated by dotted lines 104. Similar to as described in the example of FIG. 2, the current device 102 can be configured as a flux qubit, such that a current state of the current device 102 can correspond to a flux state of the flux qubit.

The current device readout system 100 includes a tunable resonator 106 and a plurality N of isolation devices 108, where N is an integer greater than one. The tunable resonator 106 is demonstrated in the example of FIG. 3 as being coupled to a feedline 110 that is configured to provide a tone signal FL having a predetermined frequency. Similar to as described previously, the tunable resonator 106 can have a resonant frequency that is associated with a current state of the current device 102 during a readout of the current device 102. Therefore, the tunable resonator 106 can receive the tone signal FL during the readout of the current device 102 from the feedline 110 to determine the current state of the current device 102. For example, the feedline 110 can be monitored (e.g., via monitoring circuitry not demonstrated in the example of FIG. 3) for a frequency response in response to application of the tone signal FL based on whether the tone signal FL was on-resonance or off-resonance with the resonant frequency of the tunable resonator 106.

The isolation devices 108 are demonstrated as inductively coupled between the tunable resonator 106 and the current device 102 in a sequential arrangement between the tunable resonator 106 and the current device 102. As an example, each of the isolation devices 108 can be arranged substantially identically, such as corresponding to the QFP 54 in the example of FIG. 2. As described herein, the terms "sequential arrangement" and "sequential inductive arrangement" describe that each of the isolation devices 108 are inductively interconnected between each other in a sequence between the tunable resonator 106 and the current device 102. The inductive interconnections between the isolation devices 108 are demonstrated in the example of FIG. 3 as dotted lines 112.

Similar to as described previously, the isolation devices 108 can each be configured to be tuned (e.g., via respective signals TN; not shown in the example of FIG. 3) to set the respective isolation devices 108 to either a first state or a second state. For example, the isolation devices 108 can be tuned substantially the same at a given time. As an example, the tuning signals can be flux signals that are inductively coupled to the respective isolation devices 108 to induce a flux in the respective isolation devices 108, such as one of a stable flux of approximately $\Phi_0/2$ corresponding to the first state and a stable flux of approximately $\Phi_0$ corresponding to the second state. For example, in the first state, the isolation devices 108 can be configured isolate the current device 102 from the tunable resonator 106, such as to prevent a flux associated with the tunable resonator 106 from affecting the current device 102. For example, by providing multiple isolation devices 108, greater isolation can be achieved relative to the current device readout system 10 in the example of FIG. 1. As another example, in the second state, the isolation devices 108 can be configured to successively amplify the current state of the current device 102 to provide the current state to the tunable resonator 106 to set the resonant frequency of the tunable resonator 106. Therefore, in the second state, the tunable resonator 106 can have a resonant frequency that is indicative of the current state to facilitate readout of the current state of the current device 102 in response to the tone signal FL.

Figure 4:
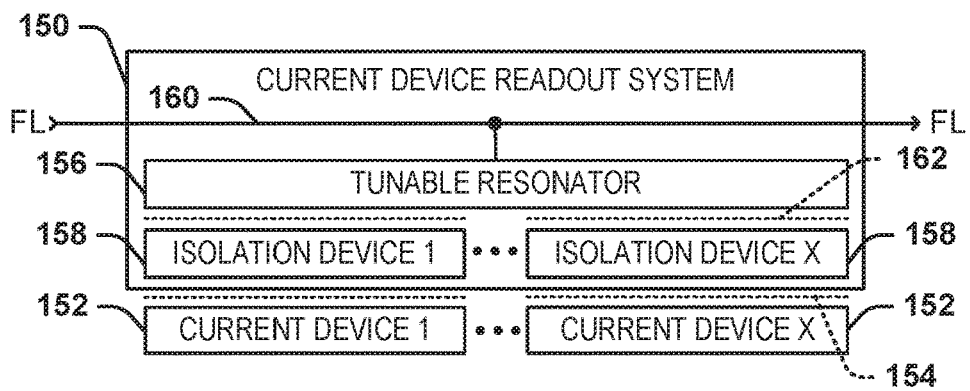
FIG. 4 illustrates yet another example of a current device readout system.

FIG. 4 illustrates an example of a current device readout system 150. The current device readout system 150 can be implemented in a number of quantum and classical computer architectures to provide data readout in a quantum logic system. In the example of FIG. 4, the current device readout system 150 is configured to read a current state of each of a plurality X of current devices 152 that is demonstrated as inductively coupled to the current device readout system 150, as demonstrated by dotted lines 154. Similar to as described in the example of FIG. 2, the current devices 152 can be configured as flux qubits, such that a current state of each of the current devices 152 can correspond to a flux state. As described in the example of FIG. 4, the current device readout system 150 can be configured to read out the current state of a given one of the current devices 152 at a given time.

The current device readout system 150 includes a tunable resonator 156 and a plurality X of isolation devices 158, where X is an integer greater than one. The tunable resonator 156 is demonstrated in the example of FIG. 4 as being coupled to a feedline 160 that is configured to provide a tone signal FL having a predetermined frequency. Similar to as described previously, the tunable resonator 156 can have a resonant frequency that is associated with a respective one of the current states of the current devices 152 that is being read during a readout of the respective current devices 152. Therefore, the tunable resonator 156 can receive the tone signal FL during the readout of a respective one of the current devices 152 from the feedline 160 to determine the current state of the respective one of the current devices 152. For example, the feedline 160 can be monitored (e.g., via monitoring circuitry not demonstrated in the example of FIG. 4) for a frequency response in response to application of the tone signal FL based on whether the tone signal FL was on-resonance or off-resonance with the resonant frequency of the tunable resonator 156.

The isolation devices 158 are each demonstrated as inductively coupled between the tunable resonator 156 and the current device 152. As an example, each of the isolation devices 158 can be arranged substantially identically, such as corresponding to the QFP 54 in the example of FIG. 2. The inductive interconnections between the isolation devices 158 and the tunable resonator 156 are demonstrated in the example of FIG. 4 as dotted lines 162.

Similar to as described previously, the isolation devices 158 can each be configured to be tuned (e.g., via respective signals TN; not shown in the example of FIG. 4) to set each of the respective isolation devices 158 to either a first state or a second state. For example, a given one of the isolation devices 158 can be tuned to the second state while the remaining isolation devices 158 are tuned to the first state 158 at a given time. As an example, the tuning signals can be flux signals that are inductively coupled to the respective isolation devices 158 to induce a flux in the respective isolation devices 158, such as one of a stable flux of approximately $\Phi_0/2$ corresponding to the first state and a stable flux of approximately $\Phi_0$ corresponding to the second state.

For example, the isolation devices 158 in the first state can be configured isolate the respective current devices 152 from the tunable resonator 156, such as to prevent a flux associated with the tunable resonator 156 from affecting the respective one of the current devices 152. As another example, in the second state, a given one of the isolation devices 158 can be configured to amplify the current state of the respective current device 152 to provide the current state to the tunable resonator 156 to set the resonant frequency of the tunable resonator 156. Therefore, in the second state, the tunable resonator 156 can have a resonant frequency that is indicative of the current state to facilitate readout of the current state of the current device 152 in response to the tone signal FL. Accordingly, the current device readout system 150 facilitates selective readout of a plurality of current devices 152 via a single tunable resonator 156, such as to minimize circuitry for reading out multiple current devices.

Figure 5:
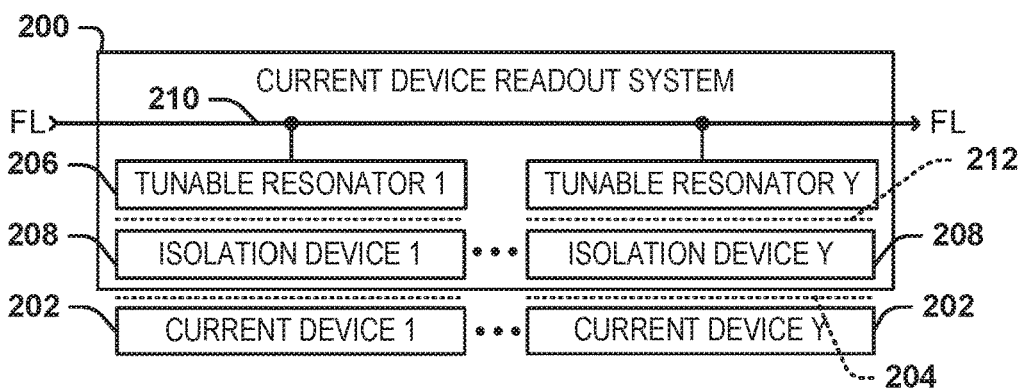
FIG. 5 illustrates yet a further example of a current device readout system.

FIG. 5 illustrates an example of a current device readout system 200. The current device readout system 200 can be implemented in a number of quantum and classical computer architectures to provide data readout in a quantum logic system. In the example of FIG. 5, the current device readout system 200 is configured to read a current state of each of at least a plurality Y of current devices 202 that are demonstrated as inductively coupled to the current device readout system 200, as demonstrated by dotted lines 204. Similar to as described in the example of FIG. 2, the current devices 202 can be configured as flux qubits, such that a current state of each of the current devices 202 can correspond to a flux state. As described in the example of FIG. 5, the current device readout system 200 can be configured to read out the current state of a given one of the current devices 202 at a given time.

The current device readout system 200 includes a plurality Y of tunable resonators 206 and a respective plurality Y of isolation devices 208. The tunable resonators 206 are each demonstrated in the example of FIG. 5 as being coupled to a feedline 210 that is configured to provide tone signals FL having predetermined frequencies. Similar to as described previously, the tunable resonators 206 can each have a resonant frequency that is associated with the current states of a respective one of the current devices 202 that is being read during a readout of the respective current device 202. Therefore, the tunable resonators 206 can each receive the tone signal FL during the readout of the respective current devices 202 from the feedline 210 to determine the current states of the respective current devices 202. For example, the feedline 210 can be monitored (e.g., via monitoring circuitry not demonstrated in the example of FIG. 5) for a frequency response in response to application of the tone signals FL based on whether the tone signals FL were on-resonance or off-resonance with the resonant frequencies of the respective tunable resonators 206 thus affecting multiplexed readout.

The isolation devices 208 are each demonstrated as inductively coupled between the tunable resonator 206 and the current device 202. As an example, each of the isolation devices 208 can be arranged substantially identically, such as corresponding to the QFP 54 in the example of FIG. 2. Additionally, the current device readout system 200 can include more than one isolation device 208 interconnecting a given one of the tunable resonators 206 and current devices 202, similar to as demonstrated in the example of FIG. 3. The inductive interconnections between the isolation devices 208 and each of the tunable resonators 206 are demonstrated in the example of FIG. 5 as dotted lines 212.

Similar to as described previously, the isolation devices 208 can each be configured to be tuned (e.g., via respective signals TN; not shown in the example of FIG. 5) to set each of the respective isolation devices 208 to either a first state or a second state. For example, a given one of the isolation devices 208 can be tuned to the second state while the remaining isolation devices 208 are tuned to the first state 208 at a given time. As an example, the tuning signals can be flux signals that are inductively coupled to the respective isolation devices 208 to induce a flux in the respective isolation devices 208, such as one of a stable flux of approximately $\Phi_0/2$ corresponding to the first state and a stable flux of approximately $\Phi_0$ corresponding to the second state.

For example, one or more of the isolation devices 208 in the first state can be configured to isolate the respective current devices 202 from a respective one of the tunable resonators 206, such as to prevent a flux associated with the respective one of the tunable resonators 206 from affecting the respective one of the current devices 202. As another example, one or more of the isolation devices 208 can be set to the second state to amplify the current state of the respective current device 202 to provide the current state to the respective tunable resonator 206 to set the resonant frequency of the respective tunable resonator(s) 206. Therefore, in the second state, the respective tunable resonator(s) 206 can have a resonant frequency that is indicative of the current state to facilitate readout of the current state of the current device 202 in response to the tone signal FL. For example, based on selective tuning or individual hardware characteristics, each of the tunable resonators 206 can have separate pairs of resonant frequencies that are unique with respect to each other and which are based on the current states of the respective current devices 202. As an example, a multi-frequency tone signal FL can be provided on the feedline 210 to selectively read the current device(s) 202 via the tunable resonator(s). Accordingly, the current device readout system 200 facilitates selective readout of one or more of the plurality of current devices 202 concurrently via a respective plurality of individual tunable resonators 206.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for reading a current state of a current device (e.g., the current device 12). At 252, a first flux bias (e.g., via the signal TN) is provided to a QFP (e.g., the QFP 54) that inductively interconnects a tunable resonator (e.g., the tunable resonator 16) and the current device to set the QFP to a first QFP state to inductively isolate the tunable resonator and the current device. The current device can have a current state corresponding to one of a first current state and a second current state. At 254, a second bias flux (e.g., via the signal TN) is provided to the QFP to set the QFP to a second QFP state to set a resonant frequency of the tunable resonator associated with the current state of the current device. At 256, a tone signal (e.g., the tone signal FL) having a predetermined frequency is provided from a feedline (e.g., the feedline 20) to the tunable resonator. At 258, the feedline is monitored in response to providing the tone signal to determine the current state of the current device.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A current device readout system comprising:
   a tunable resonator having a resonant frequency that is associated with a current state of a current device, the tunable resonator being configured to receive a tone signal having a predetermined frequency from a feedline to determine the current state of the current device; and
   an isolation device configured as a quantum flux parametron (QFP) inductively interconnecting the tunable resonator and the current device, the QFP being tunable based on a static flux to set a threshold to facilitate amplification of the current state of the current device, wherein the QFP is configured to isolate the current device in a first state and the tunable resonator and is configured to provide an amplified current state of the current device in a second state to the tunable resonator to facilitate the determination of the current state of the current device in the second state.

2. The system of claim 1, wherein the current device is configured as a flux qubit, such that the first current state corresponds to a first flux state that is based on a first current direction of a current loop associated with the flux qubit, and such that the second current state corresponds to a second flux state that is based on a second current direction of the current loop associated with the flux qubit.

3. The system of claim 1, wherein the QFP is configured as a tunable coupler with respect to the current device and with respect to the tunable resonator.

4. The system of claim 3, wherein the QFP is inductively coupled to the tunable resonator and to the current device, wherein the QFP is tunable to provide flux-isolation in a first QFP state and to amplify the current state of the current device in a second QFP state to store the current state in the QFP in the second QFP state, the amplified current state of the current device in the second state being inductively provided to the tunable resonator via the QFP to facilitate the determination of the current state of the current device in response to the tone signal.

5. The system of claim 4, wherein the QFP is inductively tuned to provide a mutual inductance between the tunable resonator and the current device to zero in the first QFP state.

6. The system of claim 5, wherein the QFP is inductively tuned to a flux of $\Phi_0/2$ to provide the mutual inductance between the tunable resonator and the current device to zero in the QFP first state.

7. The system of claim 4, wherein the QFP is adiabatically inductively tuned to a flux of $\Phi_0$ to amplify the current state of the current device in the second QFP state to store the current state in the QFP in the second QFP state.

8. The system of claim 3, wherein the QFP comprises a compound Josephson junction (CJJ) that is configured to be inductively tuned between the first QFP state and the second QFP state.

9. The system of claim 8, wherein the QFP further comprises an inductor that is tuned by the static flux to set the threshold to facilitate amplifying the current state of the current device as one of the first current state and the second current state in the second state of the QFP, wherein the first current state sets the resonant frequency of the tunable resonator to a first resonant frequency and the second current state sets the resonant frequency of the tunable resonator to a second resonant frequency.

10. The system of claim 1, wherein the static flux is a first static flux, the tunable resonator being tuned via a second static flux to set the resonant frequency of the tunable resonator to a first predetermined frequency corresponding to an on-resonant frequency associated with the first current state of the current device.

11. The system of claim 1, wherein the QFP is a first QFP of a plurality of QFPs, each of the plurality of QFPs being arranged in a sequential inductive arrangement between the tunable resonator and the current device.

12. The system of claim 1, wherein the QFP is a first QFP of a plurality of QFPs, wherein the first QFP is inductively coupled to a first current device of a plurality of current devices, wherein each of the plurality of QFPs inductively interconnects a respective one of the plurality of current devices.

13. A method for reading a current state of a current device, the method comprising:
   providing a first flux bias to a quantum flux parametron (QFP) that inductively interconnects a tunable resonator and the current device to set the QFP to a first QFP state to inductively isolate the tunable resonator and the current device, the QFP being tunable based on a static flux to set a threshold to facilitate amplification of the current state of the current device, wherein the current state of the current device corresponds to one of a first current state and a second current state;
   providing a second bias flux to the QFP to set the QFP to a second QFP state to set a resonant frequency of the tunable resonator associated with the current state of the current device, the QFP being configured to provide an amplified current state of the current device in the second current state to the tunable resonator based on the second bias flux;
   providing to the tunable resonator a tone signal having a predetermined frequency from a feedline; and
   monitoring the feedline in response to providing the tone signal to determine the current state of the current device.

14. The method of claim 13, wherein the current device is configured as a flux qubit, such that the first current state corresponds to a first flux state that is based on a first current direction of a current loop associated with the flux qubit, and such that the second current state corresponds to a second flux state that is based on a second current direction of the current loop associated with the flux qubit.

15. The method of claim 13, wherein providing the first bias flux comprises providing the first bias flux to the QFP to inductively tune the QFP to a flux of approximately $\Phi_0/2$ to provide a mutual inductance between the tunable resonator and the current device to approximately zero in the first QFP state, and wherein providing the second bias flux comprises adiabatically increasing from the first bias flux to the second bias flux to adiabatically increase a flux of the QFP to approximately $\Phi_0$ to amplify the current state of the current device in the second QFP state to store the current state in the QFP in the second QFP state.

16. The method of claim 13, wherein providing the first bias flux and second bias flux to the QFP comprises providing the first bias flux and the second bias flux to a compound Josephson junction (CJJ) that is configured to be inductively tuned between the first QFP state and the second QFP state.

17. A current device readout system comprising:
  a tunable resonator having a resonant frequency that is associated with a current state of a flux qubit, the tunable resonator being configured to receive a tone signal having a predetermined frequency from a feedline to determine the current state of the flux qubit; and
  a quantum flux parametron (QFP) inductively interconnecting the tunable resonator and the flux qubit, the QFP being tunable to inductively isolate the flux qubit and the tunable resonator in a first QFP state and to amplify the current state of the current device to facilitate the determination of the current state of the current device in a second QFP state, wherein the QFP comprises an inductor that is tuned by a static flux to set a threshold to facilitate amplifying the current state of the current device as one a first current state and a second current state in the second state of the QFP.

18. The system of claim 17, wherein the QFP is inductively tuned to a flux of $\Phi_0/2$ to provide a mutual inductance between the tunable resonator and the current device of zero in the QFP first state.

19. The system of claim 17, wherein the QFP is adiabatically inductively tuned to a flux of $\Phi_0$ to amplify the current state of the current device in the second QFP state to store one of the first current state and the second current state in the QFP in the second QFP state.

20. The system of claim 17, wherein the QFP comprises a compound Josephson junction (CJJ) that is configured to be inductively tuned between the first QFP state and the second QFP state.

* * * * *